US009853381B1

United States Patent
Stock et al.

(10) Patent No.: US 9,853,381 B1
(45) Date of Patent: Dec. 26, 2017

(54) APPARATUS AND METHOD FOR MOUNTING A CIRCUIT BOARD IN A CONNECTOR SOCKET

(71) Applicant: GERMANE SYSTEMS, LC, Chantilly, VA (US)

(72) Inventors: Michael Stock, Fairfax, VA (US); Scott Semmler, Fairfax, VA (US)

(73) Assignee: GERMANE SYSTEMS, LLC, Chantilly, VA (US)

( * ) Notice: Subject to any disclaimer, the term of this patent is extended or adjusted under 35 U.S.C. 154(b) by 0 days.

(21) Appl. No.: 15/253,430

(22) Filed: Aug. 31, 2016

(51) Int. Cl.
*H01R 12/00* (2006.01)
*H01R 12/72* (2011.01)
*H01R 13/58* (2006.01)

(52) U.S. Cl.
CPC ......... *H01R 12/721* (2013.01); *H01R 13/58* (2013.01)

(58) Field of Classification Search
CPC .................................................. H01R 12/721
USPC .................................................. 439/59, 936
See application file for complete search history.

(56) References Cited

U.S. PATENT DOCUMENTS

| | | | | |
|---|---|---|---|---|
| 4,192,478 A * | 3/1980 | Coules | ................. | F16M 11/041 174/138 D |
| 4,373,764 A | 2/1983 | Ulrich | | |
| 4,910,867 A * | 3/1990 | Weigert | ................. | H01R 43/24 174/77 R |
| 5,026,296 A * | 6/1991 | Hashiguchi | .......... | H01R 13/633 439/159 |
| 5,049,087 A * | 9/1991 | Chung | .................. | H01R 12/79 29/860 |
| 5,297,968 A * | 3/1994 | Johnson | ................ | H01R 12/78 439/329 |
| 5,383,793 A * | 1/1995 | Hsu | ....................... | H05K 7/1405 248/316.4 |
| 5,603,628 A | 2/1997 | Schapiro, Jr. | | |
| 5,660,557 A * | 8/1997 | Lemke | ............... | H01R 12/7005 439/328 |
| 5,703,754 A * | 12/1997 | Hinze | ................ | B60R 16/0239 174/562 |
| 5,716,229 A * | 2/1998 | Loder | ................. | H01R 12/774 439/493 |
| 5,846,094 A * | 12/1998 | Murray | .................. | H04M 1/02 439/493 |
| 5,876,215 A * | 3/1999 | Biernath | ............. | H01R 12/714 439/67 |
| 5,923,531 A | 7/1999 | Bachman et al. | | |
| 6,045,386 A * | 4/2000 | Boe | .................... | H01R 12/7005 439/327 |
| 6,236,574 B1 * | 5/2001 | Han | ...................... | H05K 7/1431 206/719 |
| 6,295,701 B1 | 10/2001 | Bessho | | |

(Continued)

FOREIGN PATENT DOCUMENTS

FR 2 783 100 A1 3/2000

*Primary Examiner* — Tulsidas C Patel
*Assistant Examiner* — Peter G Leigh
(74) *Attorney, Agent, or Firm* — Nixon & Vanderhye P.C.

(57) ABSTRACT

A fixture for helping to secure a circuit board to a receiving connector socket is attached to the connector socket. The fixture is then attached to the circuit board with a flowable adhesive. The flowable adhesive could be a hot-melt adhesive. Adhesive layers on the fixture can be used to attach the fixture to side and top surfaces of the connector socket.

17 Claims, 8 Drawing Sheets

(56) References Cited

U.S. PATENT DOCUMENTS

| | | | |
|---|---|---|---|
| 6,312,279 B1* | 11/2001 | Rachui | H01R 12/89 439/327 |
| 6,358,079 B1* | 3/2002 | Noble | H01R 12/7005 439/326 |
| 6,409,518 B1 | 6/2002 | Hung | |
| 6,410,176 B1* | 6/2002 | Genc | H01M 8/0247 429/457 |
| 6,964,575 B1* | 11/2005 | Sailor | H01R 13/5202 439/76.1 |
| 7,014,478 B2* | 3/2006 | Yamashita | B60R 16/0238 439/76.2 |
| 7,140,900 B1* | 11/2006 | Villanueva | H05K 7/1431 439/327 |
| 7,147,476 B1 | 12/2006 | Chang et al. | |
| 7,310,237 B2* | 12/2007 | McEwan | H01R 13/639 361/610 |
| 7,477,524 B2 | 1/2009 | Way | |
| 7,515,437 B2 | 4/2009 | Dean et al. | |
| 7,658,628 B2 | 2/2010 | Guan et al. | |
| 7,713,066 B2 | 5/2010 | Hass | |
| 7,806,699 B2* | 10/2010 | Mark | H01R 13/2421 439/66 |
| 7,850,475 B1* | 12/2010 | Feldman | H01R 13/6275 439/328 |
| 8,011,088 B2* | 9/2011 | McEwan | H01R 13/639 29/593 |
| 8,092,239 B2* | 1/2012 | Nishiyama | H01R 12/7005 439/157 |
| 8,254,123 B2 | 8/2012 | Sun | |
| 8,714,772 B1 | 5/2014 | Levante et al. | |
| 8,797,746 B2* | 8/2014 | Hung | G06F 13/409 361/736 |
| 9,059,457 B2* | 6/2015 | Yang | H01M 2/30 |
| 2005/0181642 A1 | 8/2005 | Juntwait | |
| 2007/0099513 A1* | 5/2007 | Savage | B29C 45/14336 439/638 |
| 2009/0186501 A1* | 7/2009 | Kao | H01R 13/5219 439/153 |
| 2016/0294087 A1* | 10/2016 | Norton | H01R 12/7005 |

* cited by examiner

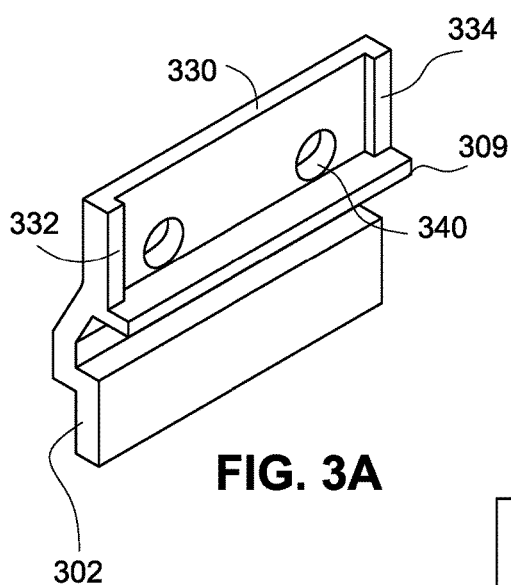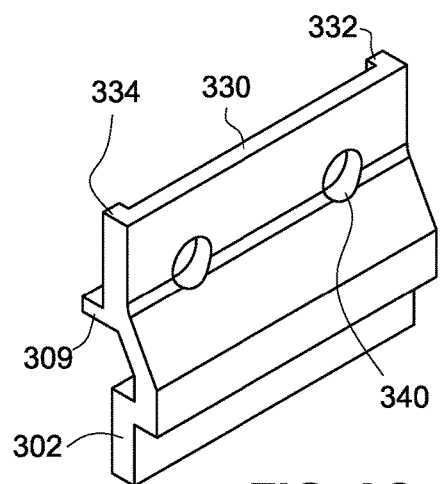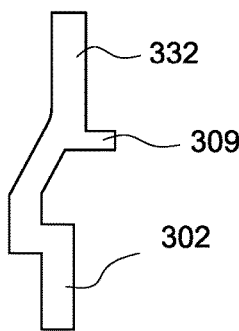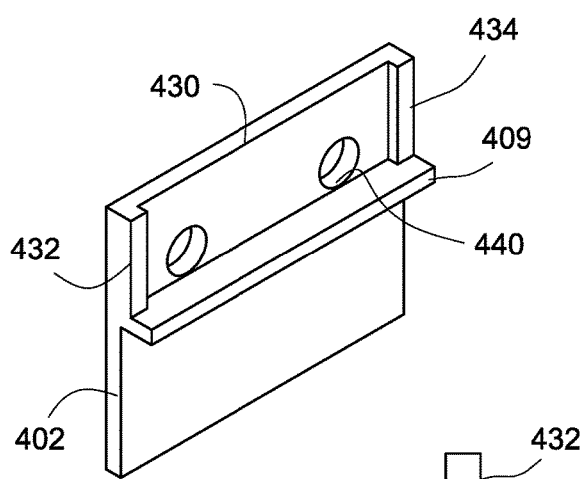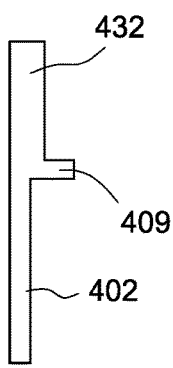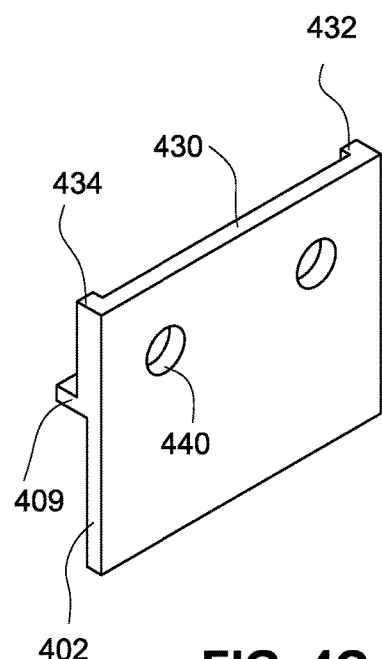

APPARATUS AND METHOD FOR MOUNTING A CIRCUIT BOARD IN A CONNECTOR SOCKET

BACKGROUND

This technology disclosed in this application relates to securing a circuit board to a receiving connector socket. The circuit board can be a printed circuit board having a plurality of electrical contacts formed along one side edge of the circuit board. The edge of the circuit board is inserted into a receiving slot of a connector socket. Electrical contacts in the slot of the connector socket connect to corresponding ones of the electrical contacts on the edge of the circuit board. Such an arrangement is commonly used to mount a circuit board with various electrical components onto a computer motherboard of a PC or server.

When a circuit board is mounted in the slot of a receiving connector socket, and the assembly is subjected to shock, vibration or other accelerative forces, the circuit board can become partially or fully dislodged from the connector socket. Also, even if the circuit board does not become fully or partially dislodged, the accelerative forces can disrupt the electrical connections between the electrical contacts on the edge of the circuit board and the corresponding electrical contacts in the receiving slot of the connector socket. Even when physical contact between the corresponding electrical contacts is not broken, movement of the circuit board with respect to the connector socket may cause an electrical resistance of the connection to vary over time. And this change in electrical resistance alone could cause problems for signals traversing the connection. As a result of these factors, when such an assembly is subjected to significant shock and vibration, it is common for an electrical computing system using this arrangement to report faults or errors, or completely stop responding.

It would be desirable to mount the circuit board in the connector socket in such a way that shock, vibration and other accelerative forces are less able to disrupt the electrical connections between electrical contacts on the circuit board and corresponding electrical contact in the receiving slot of the connector socket.

BRIEF DESCRIPTION OF THE DRAWINGS

FIGS. 3A and 3C are perspective views of a third embodiment of a fixture used to attach a circuit card to a connector socket, and FIG. 3B is a side view of the fixture illustrated in FIGS. 3A and 3C;

FIGS. 4A and 4C are perspective views of a fourth embodiment of a fixture used to attach a circuit card to a connector socket, and FIG. 4B is a side view of the fixture illustrated in FIGS. 4A and 4C;

DETAILED DESCRIPTION OF EXEMPLARY EMBODIMENTS

Figure 1A:
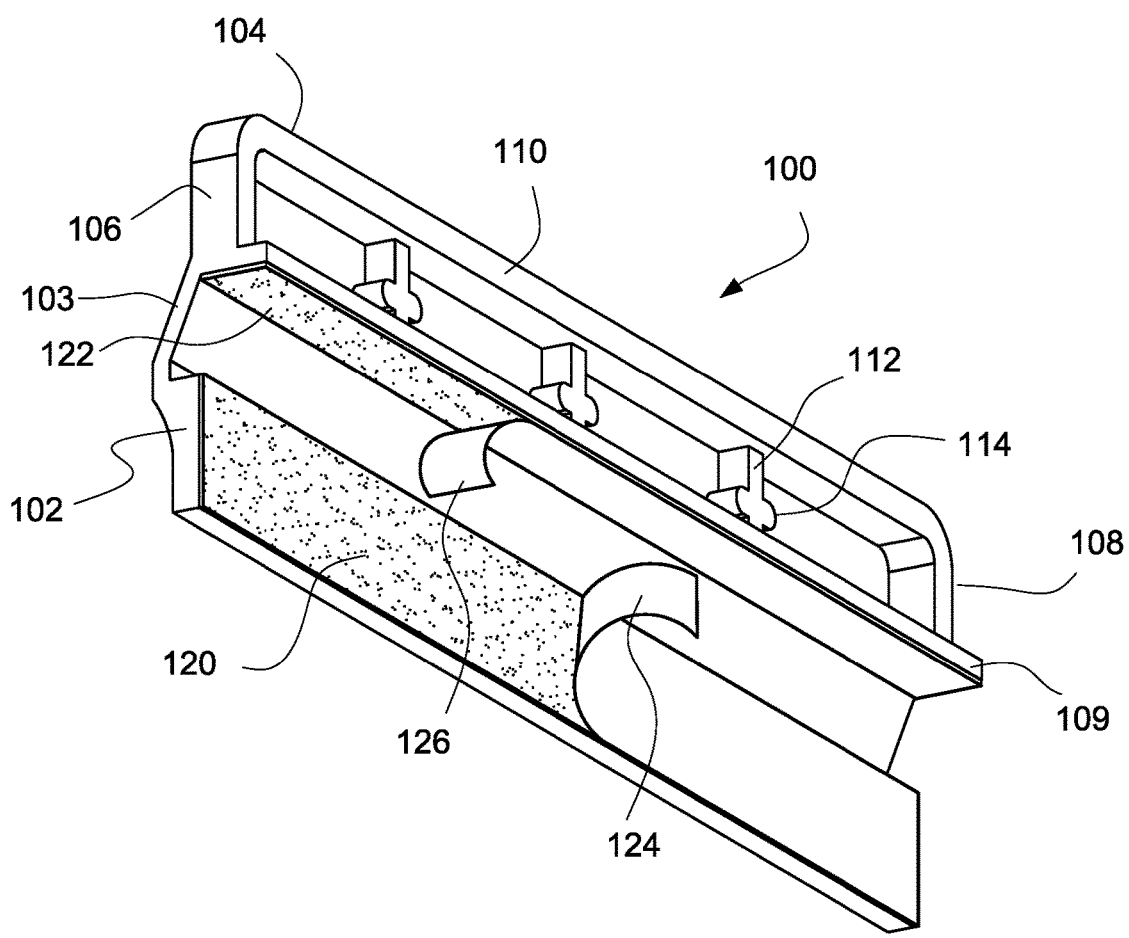
FIGS. 1A-1C are perspective views of a fixture used to attach a circuit card to a connector socket.
Figure 1B:
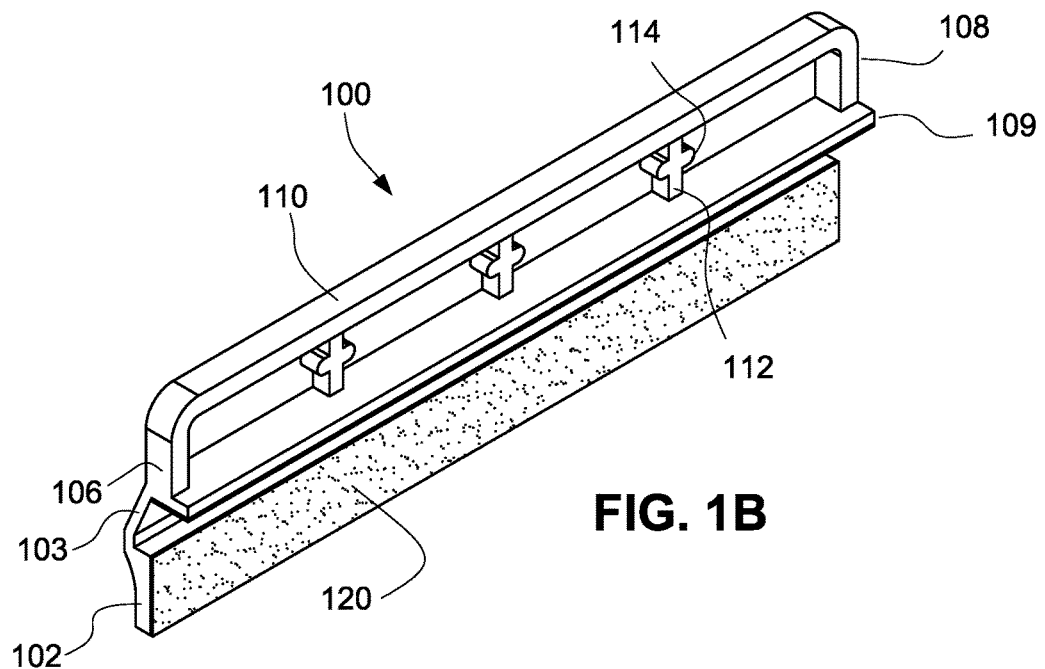
Figure 1C:
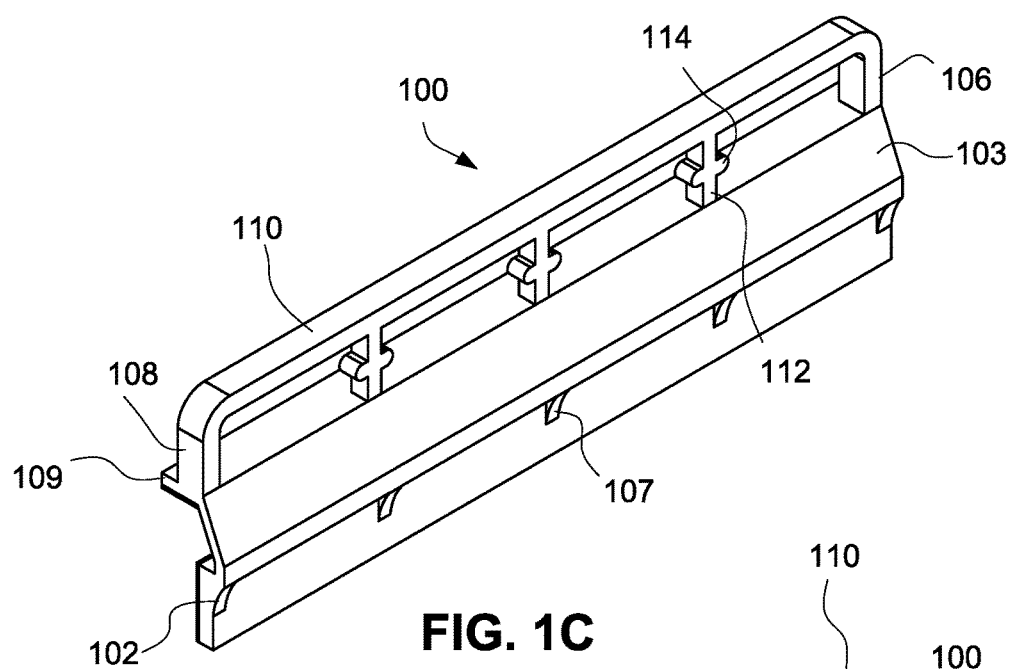
Figure 1D:
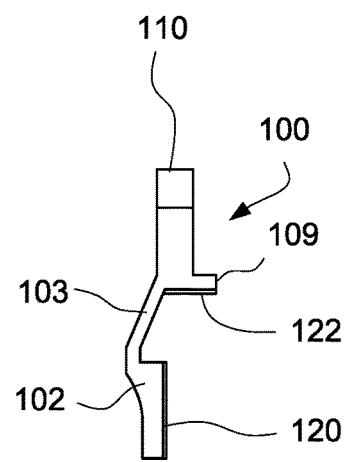
FIG. 1D is a side view of the fixture illustrated in FIGS. 1A-1C.

The following description references a "circuit board." The term circuit board is intended to broadly cover virtually any type of circuit board or printed circuit board that has electrical contacts along one side edge, and which is designed to be inserted into a receiving slot of a connector socket. Such circuit boards could bear any number of different electrical components, including memory modules and processors.

FIGS. 1A-1D illustrate a first embodiment of a fixture which can be used to help attach a circuit card to a connector socket. The fixture 100 includes a main body 102, which is configured to be attached to a side surface of a connector socket. An adhesive layer 120 can be located on the inner surface of the main body 102, and a release film 124 can cover the adhesive layer 120.

The fixture 100 includes a middle portion 103, which is shaped to conform to a projection that exists on a side surface of a connector socket, as will be explained in greater detail below. The fixture 100 also includes a top surface connector 109, which is configured to abut and attach to a top surface of a connector socket when the main body 102 of the fixture 100 is attached to a side surface of the connector socket. A second layer of adhesive 122 can be formed on the top surface connector 109, and a second release film 126 may be placed over top of the adhesive layer 122.

The fixture 100 includes an adhesive well 104 which is formed by a substantially U-shaped strip of material. The U-shaped strip of material includes a first leg 106 that extends upward away from the main body 102, and a second leg 108 that also extends upward away from the main body 102. A cross portion 110 joins the upper ends of the first leg 106 and the second leg 108. The interior space between the first leg 106, second leg 108 and cross portion 110 form the adhesive well.

In some embodiments, the adhesive well may also include one or more interim legs 112. The interim legs 112 may include an extension 114 that extends outward away from the sides of the interim leg 112. Although the embodiment illustrated in FIGS. 1A-1D includes interim legs which essentially extend vertically upward from the main body 102, in alternate embodiments the interim legs could take other shapes and forms. For example, the interim legs could extend from the top of the main body 102 to the cross-portion 110 in a slanted or diagonal direction. As will be explained in more detail below, the interim legs 112 help to increase a bond strength between an adhesive and the fixture.

Figure 2A:
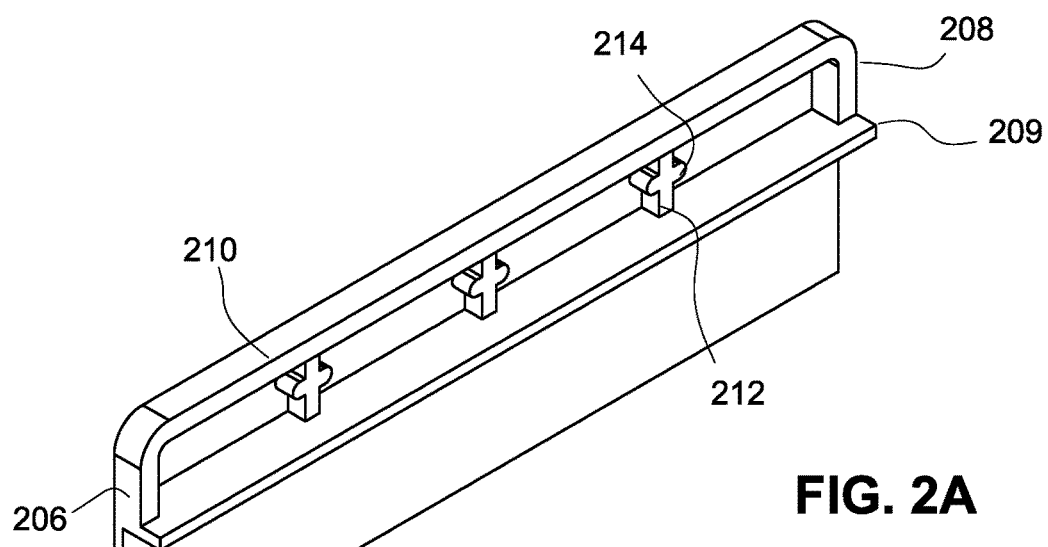
FIGS. 2A and 2C are perspective views of a second embodiment of a fixture used to attach a circuit card to a connector socket.
Figure 2B:
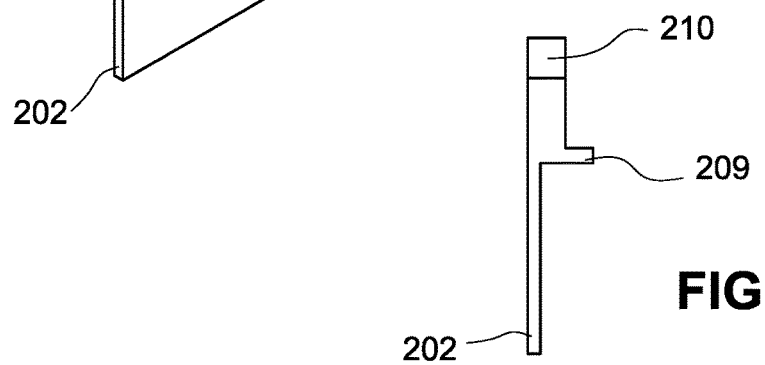
FIG. 2B is a side view of the fixture illustrated in FIGS. 2A and 2C.
Figure 2C:
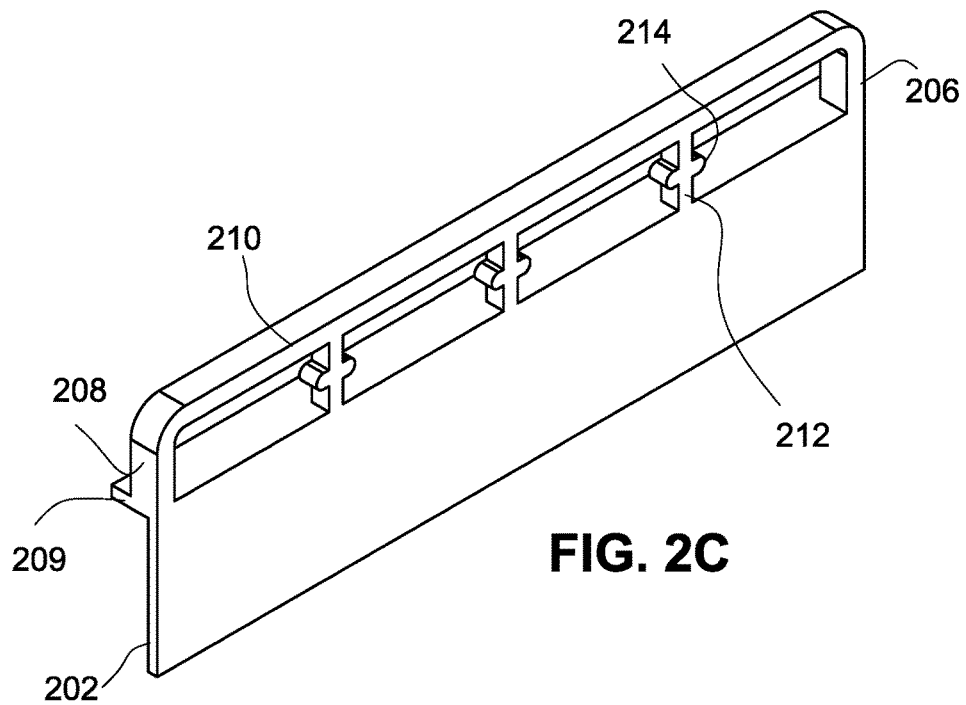

FIGS. 2A-2C show a second embodiment of a fixture 100 which can be used to attach a circuit card to a connector socket. In this embodiment, the main body 202 and the top surface connector 209 essentially form an L-shape. As with the first embodiment, an adhesive well is formed by a U-shaped strip of material which includes a first leg 206, a second leg 208 and a cross portion 210. This embodiment also includes interim legs 212 with extensions 214.

FIGS. 3A-3C illustrate a third embodiment of a fixture which can be used to attach a circuit card to a connector socket. In this embodiment, the fixture includes a main body 302 configured to be attached to a side surface of a connector socket. This embodiment also includes a top surface connector 309 configured to be attached to a top surface of a connector socket.

In this embodiment, the adhesive well is formed by a lateral wall 330 and first and second end walls 332, 334. The inner surfaces of the first end wall 332 and second end wall 334 may abut the side surface of a circuit card when the fixture is attached to a connector socket. One or more apertures 340 are formed through the lateral wall 330. The apertures 340 allow an adhesive to be injected into the space formed between the inner surface of the lateral wall 330 and a circuit card located adjacent the lateral wall 330. In alternate embodiments, one or more apertures 340 could also be formed in the first end wall 332 or second end wall 334. Moreover, in other embodiments no aperture could be present in the lateral wall 330, and an adhesive could be injected downward through the top into a space formed between the inner surface of the lateral wall 330 and an adjacent circuit card.

FIGS. 4A-4C illustrate a fourth embodiment of a fixture which can be used to attach a circuit card to a connector socket. In this embodiment, the main body 402 and the top surface connector 409 essentially form an L-shape. However, the adhesive well in this embodiment is similar to the adhesive well described above in connection with the third embodiment illustrated in FIGS. 3A-3C.

Figure 5:
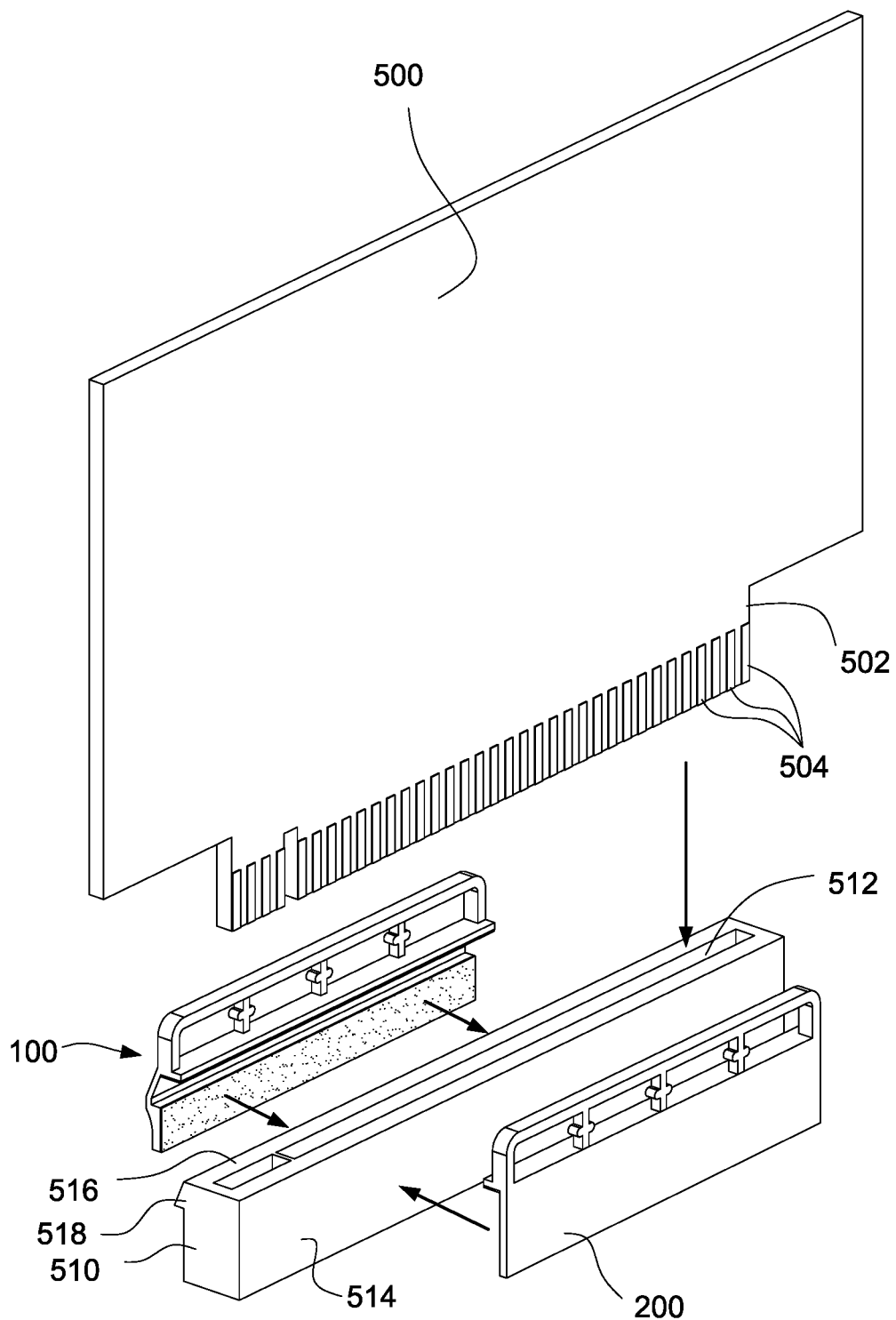
FIG. 5 is an exploded perspective view showing how a circuit card is mounted in a connector socket, and illustrating how two fixtures are attached to the connector socket and circuit board.
Figure 6:
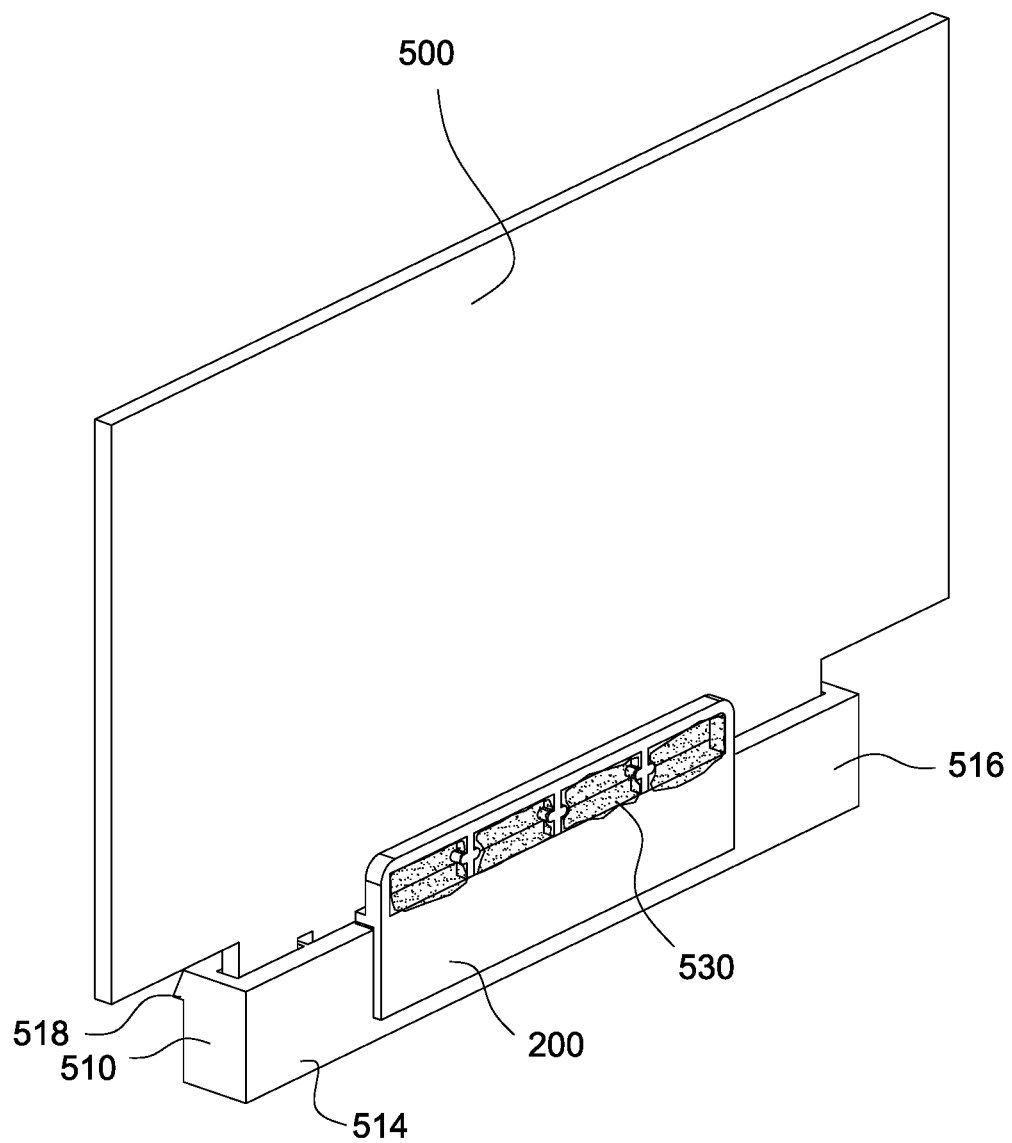
FIG. 6 is a perspective view showing a circuit card mounted in a connector socket with a fixture attached to the circuit card and the connector socket.

As illustrated in FIG. 5, a circuit card 500 having a plurality of electrical contacts 504 formed along a bottom edge 502 of the circuit card 500 can be mounted into a connector socket 510. The connector socket 510 includes a receiving slot 512 which includes electrical contacts that are designed to connect to corresponding ones of the electrical contacts 504 on the bottom edge 502 of the circuit card 500. Once the circuit card 500 has been seated into the receiving slot 512 of the connector socket 510, as illustrated in FIG. 6, one or more fixtures 100/200 can be used to help secure the circuit card 500 to the connector socket 510. In particular, the one or more fixtures can help to immobilize the circuit card 500 with respect to the connector socket 510 so that the electrical connections between the electrical contacts 504 on the circuit card 500 and the corresponding electrical contacts in the receiving slot 512 of the connector socket 510 are not interrupted or impaired when the assembly is subjected to shock, vibration or other accelerative forces.

As illustrated in FIG. 5, when one wishes to attach a fixture 100 to a side of a connector socket 510 having a projection 518, one peels away the first release film 124 and the second release film 126 from the first adhesive layer 120 and the second adhesive layer 122, respectively. One then presses the first adhesive layer 120 on the main body 102 of the fixture into engagement with a side surface 514 of the connector socket 510 that includes a projection 518, and presses the second adhesive layer 122 on the top surface connector 109 of the fixture 100 into engagement with a top surface 516 of the connector 510. The projection 518 on the left side of the connector socket 510 is accommodated by the shape of the middle portion 103 of the fixture 100. Also, the shape of the middle portion 103, which conforms to the underside of the projection 518 on the connector socket 510, helps to secure the fixture 100 to the connector socket 510.

As also shown in FIG. 5, a fixture 200, such as the one illustrated in FIGS. 2A-2D, can be used on a side of the connector socket 510 that does not include a projection. The fixture 200 would be attached to the right side of the connector socket 510 in much the same way that the first fixture 100 was connected to the left side of the connector socket 510.

Attaching the fixtures 100/200 to the sides of the connector socket 510 brings the adhesive wells formed on the top of the fixtures 100/200 to a position adjacent the side surfaces of the circuit card 500. One can attach one or more fixtures to a connector socket 510 before a circuit card 500 is mounted in the receiving slot 512 of the connector socket 510, or after a circuit card 500 has already been mounted in the connector socket 510.

Once the fixtures 100/200 are attached to the connector socket 510, and the circuit card 500 is mounted in the receiving slot 512 of the connector socket 510, one deposits or applies an adhesive 530 in the adhesive wells so that the adhesive substantially fills the interior space formed by the first leg 106, second leg 108 and cross portion 110. The adhesive bonds to both the adhesive wells of the fixtures 100/200, and to the side surfaces of the circuit card 500. When provided, the interim legs 112 and extensions 114 provide additional portions of the fixture to which the adhesive may bond.

Although the embodiment illustrated in FIGS. 5 and 6 shows two fixtures 100/200 mounted on either side of a circuit card 500, only a single fixture located on only a single side of the circuit card 500 could be used to help attach a circuit card 500 to a connector socket 510. Also, although FIGS. 5 and 6 show only a single fixture 100/200 located on each side of the circuit card 500, in alternate embodiments multiple fixtures could be mounted on each side or on a single side of the circuit card 500 and connector socket 510. This could be advantageous when the circuit card 500 and connector socket 510 are particularly long.

The adhesive 530 which is used to attach a fixture to a circuit card could take many different forms. In some embodiments, the adhesive 530 could be a hot-melt adhesive. Such hot-melt adhesives are typically applied or deposited using a heating gun. The heating gun heats a hot-melt adhesive, which is substantially solid at room temperature, to a temperature at which the hot-melt adhesive becomes flowable. The heated, flowable hot-melt adhesive can then flow into the space formed by the adhesive well so that the adhesive can bond to the fixture and a side of the circuit card. Once the flowable hot-melt adhesive has been deposited, the hot-melt adhesive cools back into a solid form, and bonds to the fixture and the side surface of the circuit card.

In alternate embodiments, other types of adhesives could be used. for example, the adhesive could be one which is initially flowable, but which cures when exposed to the atmosphere. The adhesive could also be a flowable multi-component epoxy that hardens and cures shortly after the two components are mixed together. In preferred embodiments, the adhesives would initially be flowable so that the adhesive can be deposited into the adhesive well of the fixture 100. The adhesive would then harden or cure so that the adhesive bonds to both the side surface of the circuit card 500, and also to elements of the fixture 100 which form the adhesive well.

In preferred embodiments, the adhesive which is used to attach a fixture to a side surface of a circuit card would provide significant bonding strength, but also would be capable of releasing the circuit card when the circuit card is pried away from the fixture. This would make it possible to remove a circuit card from a connector socket in the future so that can be repaired or replaced.

In some embodiments, the fixture may be configured so that the adhesive deposited into the adhesive well of the fixture only bonds to the circuit card and the fixture itself. In other embodiments, the fixture may be configured so that the deposited adhesive also contacts and bonds to a portion of the receiving connector socket.

Figure 7:
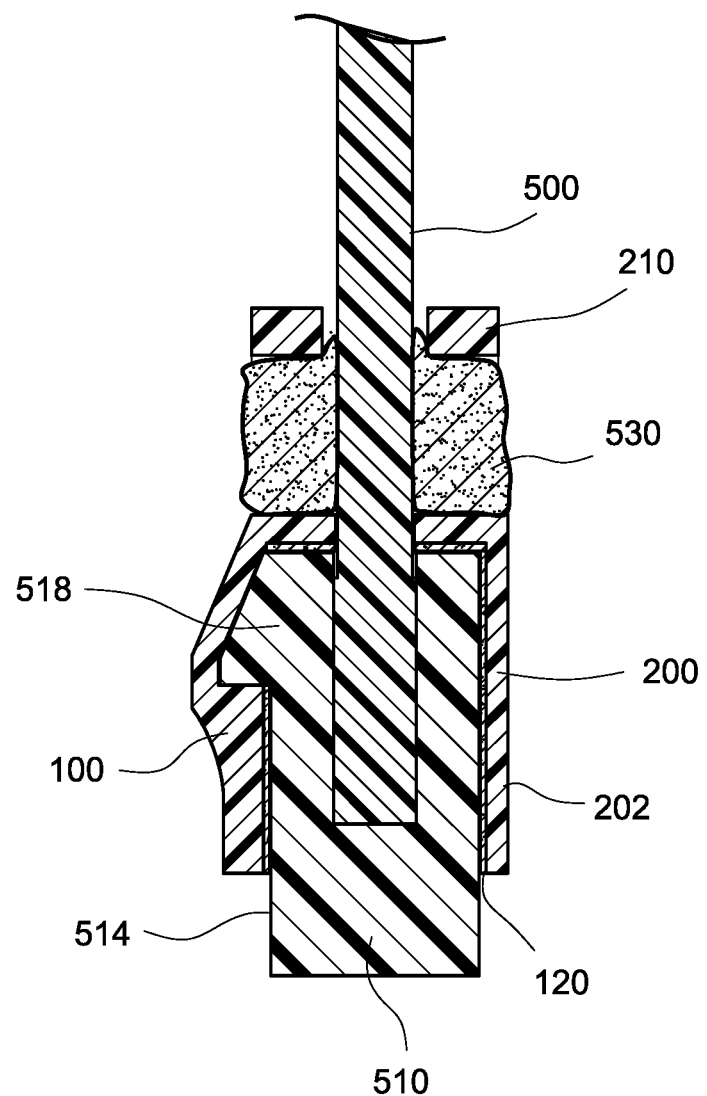
FIG. 7 is a cross-sectional view taken along section line 7-7 illustrating a circuit card mounted in a connector socket, with fixtures on either side of the circuit card attached to the circuit card and the connector socket.

FIG. 7 illustrates a cross-sectional view showing a circuit card 500 mounted in the receiving slot 512 of a connector socket 510. FIG. 7 illustrates the main body 102 of a first fixture 100 adhered to the left side surface 514 of the connector socket 510. FIG. 7 also illustrates the top surface connector 109 of the first fixture 100 adhered to a top surface 516 of the connector socket 510 via the second adhesive layer 122. The second fixture 200 on the right side of the connector socket 510 is attached to the connector socket 510 in a similar manner.

Figure 8:
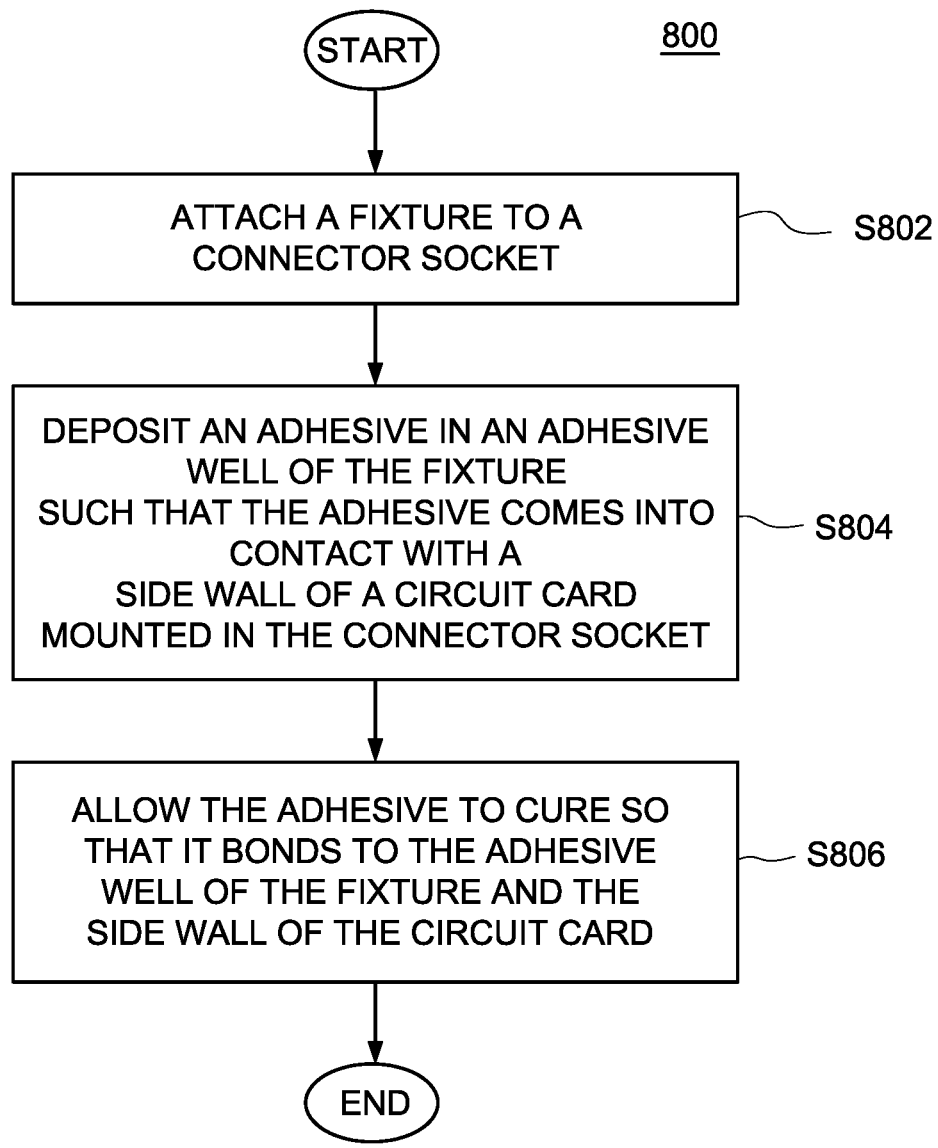
FIG. 8 is a flow diagram illustrating steps of a method embodying the technology.

FIG. 8 illustrates steps of a method 800 for securing a circuit card in a receiving connector socket. The method would be performed using a fixture as described above. The method 800 begins and proceeds to step S802, where the fixture is attached to a receiving connector socket. The fixture could be attached to the connector socket before a circuit board is mounted in the receiving slot of the connector socket. Alternatively, the circuit board could be mounted in the receiving slot of the connector socket first, and the fixture could thereafter be attached to the connector socket.

As mentioned above, the fixture could be attached to the connector socket using an adhesive layer that is already present on the fixture. Alternatively, an adhesive could be applied to the fixture and/or to the connector socket, and the fixture could then be attached to the connector socket using that adhesive. If a curable adhesive is used to attach the fixture to the connector socket, it may be necessary to wait for the adhesive to partially or fully cure before moving on to the next step of the method.

In still other embodiments, one or more fasteners could be used to attach the fixture to the connector socket. The fastener could include a screw or bolt, or spring clip arrangement. Virtually any sort of fastener could be used to attach the fixture to the connector socket. In some embodiments, the fixture or the connector socket may include a shape or feature that facilitates the use of a fastener. For example, a spring clip on the fastener may clip to a corresponding hook or groove formed on the connector socket, or vice versa.

In some embodiments the fixture may be attached only to the side of the connector socket. In other embodiments, the fixture could be attached to only the top surface of the connector socket. In still other embodiments, the fixture could be attached to an underside of the connector socket via a fastener, such as a spring clip. In still other embodiments, the fixture could be attached to multiple surfaces of the connector socket. Also, in some embodiments, the fixture could be attached to the connector socket via a combination of an adhesive and one or more fasteners.

In step S804, an adhesive is deposited into an adhesive well of the fixture. In step S806, the adhesive cures so that the adhesive bonds to both the adhesive well of the fixture, and to the circuit card. Once the adhesive has cured, the circuit card is attached the fixture, and the fixture is attached to the connector socket. As a result, the circuit card is attached to the connector socket.

In some embodiments, the adhesive could be a flowable adhesive that cures. For example, the adhesive could be a hot-melt adhesive that is applied to the adhesive well of the fixture when in a heated molten or liquid state, and the hot-melt adhesive will cure as it cools. In other embodiments, the adhesive could be a flowable adhesive that cures when exposed to the atmosphere. In still other embodiments, the adhesive could be a multi-component epoxy, where two or more flowable components are mixed together, and where a chemical reaction between the components causes the mixture to cure over time.

The foregoing examples show how a fixture embodying the technology could be used to attach a circuit card to a connector socket. In alternate embodiments, a similar fixture could be used to attach a circuit card to some other element within a computer or server. Likewise, a fixture embodying the technology could be used to attach something other than a circuit card to an element of a computer or server. For example, a suitably configured fixture could be used to attach a connector to a computer or server enclosure. Such a fixture would still include an adhesive well which receives a flowable adhesive that attaches the fixture to either the connector or the computer or server enclosure, or both. Thus, the above descriptions of how a fixture embodying the technology can be used to attach a circuit card to a receiving connector socket should in no way be considered limiting of the disclosed technology.

A fixture with an adhesive well could also be used to secure a cable or wiring to an element of a computer or server. In this instance, the fixture would again be attached to an element of the computer or server. The cable or wiring could be located adjacent the adhesive well, or it could pass through the adhesive well. A flowable adhesive would then be deposited in the adhesive well to attach the cable or wiring to the fixture. Depending in the configuration, the flowable adhesive might also serve to attach the fixture to the element of the computer or server.

The forgoing exemplary embodiments are intended to provide an understanding of the disclosure to one of ordinary skill in the art. The forgoing description is not intended to limit the inventive concept described in this application, the scope of which is defined in the following claims.

What is claimed is:

1. An apparatus for securing a circuit board to a connector socket, comprising:
   a main body configured to be attached to a side surface of the connector socket; and
   an adhesive well that extends from the main body, the adhesive well being configured such that when the main body is attached to the side surface of the connector socket, and a circuit board is mounted in the connector socket, the adhesive well will overlay or surround only a portion of the circuit board that is located adjacent a top surface of the connector socket, and wherein the adhesive well is configured such that when an adhesive is deposited into the adhesive well to substantially fill the adhesive well, to thereby attach the adhesive well to the circuit board, the adhesive adheres to the circuit board only at a portion of the circuit board that is located adjacent the top surface of the connector socket.

2. The apparatus of claim 1, further comprising an adhesive layer on the main body that is configured to attach the main body to the side surface of the connector socket.

3. The apparatus of claim 1, further comprising a top surface connector that extends from the main body and that is configured to be attached to a top surface of the connector socket when the main body is attached to the side surface of the connector socket.

4. The apparatus of claim 3, further comprising:
a first adhesive layer on the main body that is configured to attach the main body to the side surface of the connector socket; and
a second adhesive layer on the top surface connector that is configured to attach the top surface connector to the top surface of the connector socket.

5. The apparatus of claim 1, wherein the adhesive well comprises a generally U-shaped strip of material that includes:
a first leg that extends away from a first end of the main body;
a second leg that extends away from a second end of the main body; and
a cross-portion that is spaced apart from the main body, that extends in a length direction of the main body, and which is attached to distal ends of the first and second legs.

6. The apparatus of claim 5, wherein the adhesive well also includes at least one interim leg that extends between the main body and the cross-portion.

7. The apparatus of claim 6, wherein each at least one interim leg includes an extension that extends away from a mid-point of the interim leg.

8. The apparatus of claim 1, wherein the adhesive well comprises:
a lateral wall that extends upward away from the main body and which is configured such that when the main body is attached to the side surface of the connector socket, and a circuit board is mounted in the connector socket, an inner surface of the lateral wall will be spaced apart from an outer surface of the circuit board;
a first end wall located at a first end of the lateral wall; and
a second end wall located at a second end of the lateral wall, wherein the first and second end walls are configured such that when the main body is attached to the side surface of the connector socket, and a circuit board is mounted in the connector socket, the first and second end walls extend from the lateral wall toward the circuit board.

9. The apparatus of claim 8, wherein at least one aperture is formed through the lateral wall.

10. The apparatus of claim 1, wherein the adhesive well is configured to overlay or surround only a portion of the circuit board upon which no electrical components are mounted.

11. A method of securing a circuit board to a connector socket, where the circuit board includes a plurality of electrical contacts along a first side edge of the circuit board, comprising:
inserting the first side edge of the circuit board into a receiving slot of the connector socket;
attaching a fixture to the connector socket, wherein the fixture includes an adhesive well that extends from a main body of the fixture, the adhesive well being configured to overlay or surround only a portion of a side surface of the circuit board that is located adjacent a top surface of the connector socket; and
depositing an adhesive in the adhesive well to substantially fill the adhesive well, and allowing the adhesive to cure such that the adhesive adheres to the adhesive well of the fixture and to only the portion of the side surface of the circuit board located adjacent the top surface of the connector socket.

12. The method of claim 11, wherein attaching the fixture to the connector socket comprises attaching the fixture to a side surface of the connector socket.

13. The method of claim 12, wherein attaching the fixture to the connector socket further comprises attaching the fixture to a top surface of the connector socket.

14. The method of claim 11, wherein attaching the fixture to the connector socket comprises pressing an adhesive layer present on the fixture into engagement with a surface of the connector socket.

15. The method of claim 11, wherein depositing the adhesive in the adhesive well comprises depositing a hot-melt adhesive in the adhesive well while the hot-melt adhesive is in a molten or flowable state.

16. The method of claim 11, wherein depositing the adhesive in the adhesive well comprises injecting the adhesive through an aperture in a wall of the fixture that forms a portion of the adhesive well.

17. The method of claim 11, wherein attaching the fixture to the connector socket comprises attaching the fixture to the connector socket at a location which results in the adhesive well overlaying or surrounding only a portion of the circuit board upon which no electrical components are mounted.

* * * * *